United States Patent
Chiu et al.

(10) Patent No.: US 8,664,705 B2
(45) Date of Patent: Mar. 4, 2014

(54) METAL-OXIDE-SEMICONDUCTOR CAPACITOR

(75) Inventors: Kai-Ling Chiu, Pingtung County (TW); Chao-Sheng Cheng, Taichung (TW); Chih-Yu Tseng, Hsinchu County (TW); Yu-Jen Liu, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/481,963

(22) Filed: May 29, 2012

(65) Prior Publication Data

US 2013/0320421 A1 Dec. 5, 2013

(51) Int. Cl.
*H01L 27/108* (2006.01)

(52) U.S. Cl.
USPC .......................... 257/296; 257/357

(58) Field of Classification Search
USPC .................................. 257/296, 357
See application file for complete search history.

(56) References Cited

U.S. PATENT DOCUMENTS

| | | | |
|---|---|---|---|
| 6,063,659 A | 5/2000 | Le | |
| 6,407,412 B1 * | 6/2002 | Iniewski et al. | 257/107 |
| 6,764,930 B2 | 7/2004 | Chu et al. | |
| 7,276,746 B1 * | 10/2007 | Xu et al. | 257/258 |
| 7,838,383 B2 | 11/2010 | Khan et al. | |
| 2008/0035977 A1 * | 2/2008 | Edward et al. | 257/301 |
| 2008/0128756 A1 * | 6/2008 | Satoh | 257/203 |
| 2008/0272408 A1 * | 11/2008 | Vora | 257/272 |
| 2011/0024813 A1 | 2/2011 | Khan et al. | |
| 2011/0109380 A1 | 5/2011 | Park et al. | |

* cited by examiner

*Primary Examiner* — Anthony Ho
(74) *Attorney, Agent, or Firm* — Winston Hsu; Scott Margo

(57) ABSTRACT

A MOS capacitor includes a substrate, a p-type MOS (pMOS) transistor positioned on the substrate, and an n-type MOS (nMOS) transistor positioned on the substrate. More important, the pMOS transistor and the nMOS transistor are electrically connected in parallel. The MOS transistor further includes a deep n-well that encompassing the pMOS transistor and the nMOS transistor.

7 Claims, 4 Drawing Sheets

METAL-OXIDE-SEMICONDUCTOR CAPACITOR

BACKGROUND OF THE INVENTION

1. Field of the Invention

The present invention relates to a metal-oxide-semiconductor capacitor (hereinafter abbreviated as MOS capacitor), more particularly, to a MOS capacitor with improved capacitance linearity.

2. Description of the Prior Art

A capacitor is one of the essential passive devices for integrated circuits (ICs). Often, capacitors occupy substantial portion of the die area for obtaining large capacitance value when compared with other components. To minimize the area occupied by the capacitors, it is desirable to make the capacitors as small as possible. And thus MOS capacitor, which occupies less area, is developed as a countermeasure to the abovementioned problem.

However, one fatal disadvantage of the MOS capacitors is its poor capacitance linearity performance over voltage range. Please refer to FIG. 1, which shows a capacitance-voltage (C-V) characteristic curve of a conventional MOS capacitor. As shown in FIG. 1, it is found that the conventional MOS capacitor is highly non-linear over its voltage operating range. Consequently, the conventional MOS capacitor is not preferable for applications require high linearity.

Therefore, there is a continuing need in the semiconductor processing art to develop a MOS capacitor having improved capacitance linearity.

SUMMARY OF THE INVENTION

According to an aspect of the present invention, a MOS capacitor is provided. The MOS capacitor includes a substrate, a p-type MOS (pMOS) transistor positioned on the substrate, and an n-type MOS (nMOS) transistor positioned on the substrate. More important, the pMOS transistor and the nMOS transistor are electrically connected in parallel.

According to the MOS capacitor provided by the present invention, the pMOS transistor and the nMOS transistor are electrically connected in parallel to construct said MOS capacitor. Because the pMOS transistor and the nMOS transistor are electrically connected in parallel, the final MOS capacitor obtains a capacitance more linear than the conventional individual pMOS capacitor and/or the conventional individual nMOS capacitor. Consequently, the MOS capacitor provided by the present invention is more preferable to applications require high linearity.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
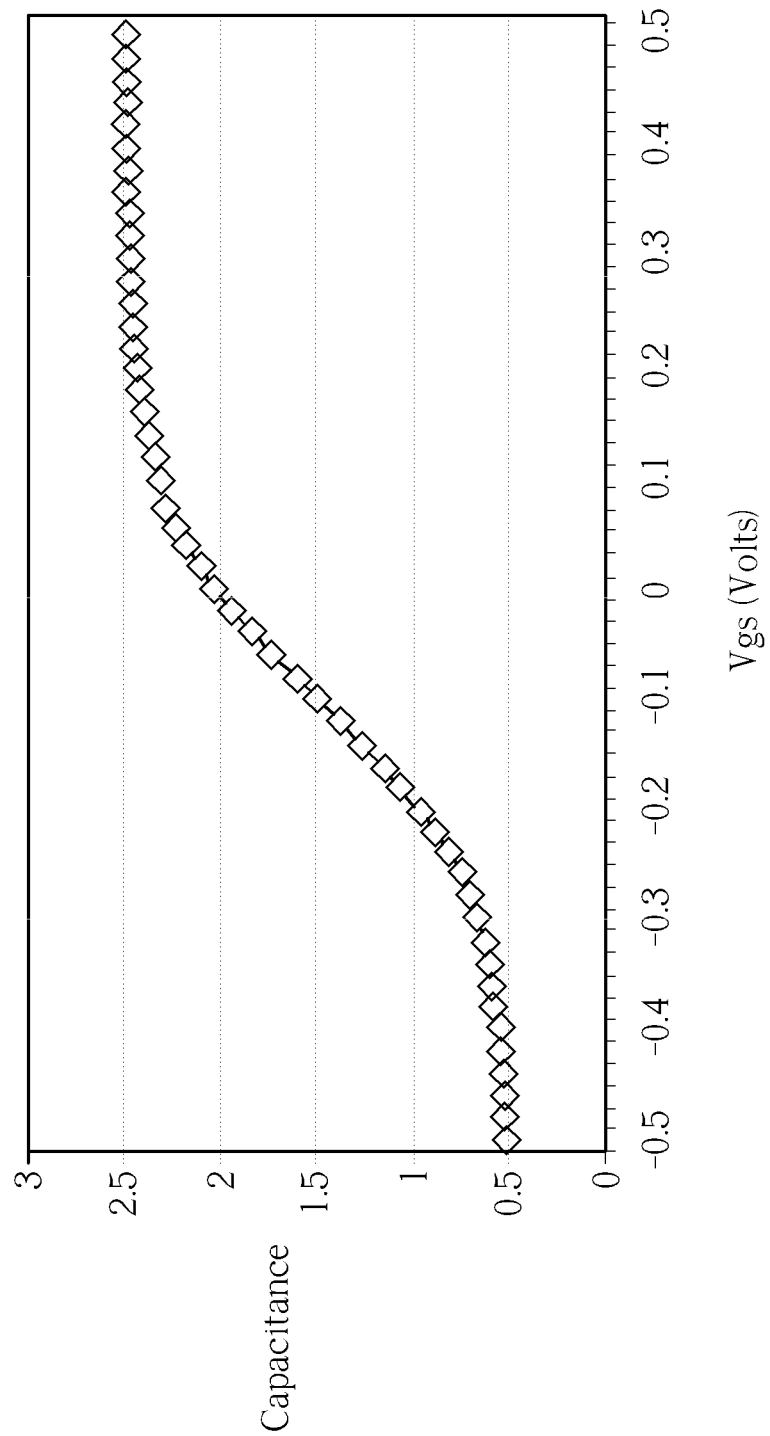
FIG. 1 shows a C-V characteristic curve of a conventional MOS capacitor.
Figure 2:
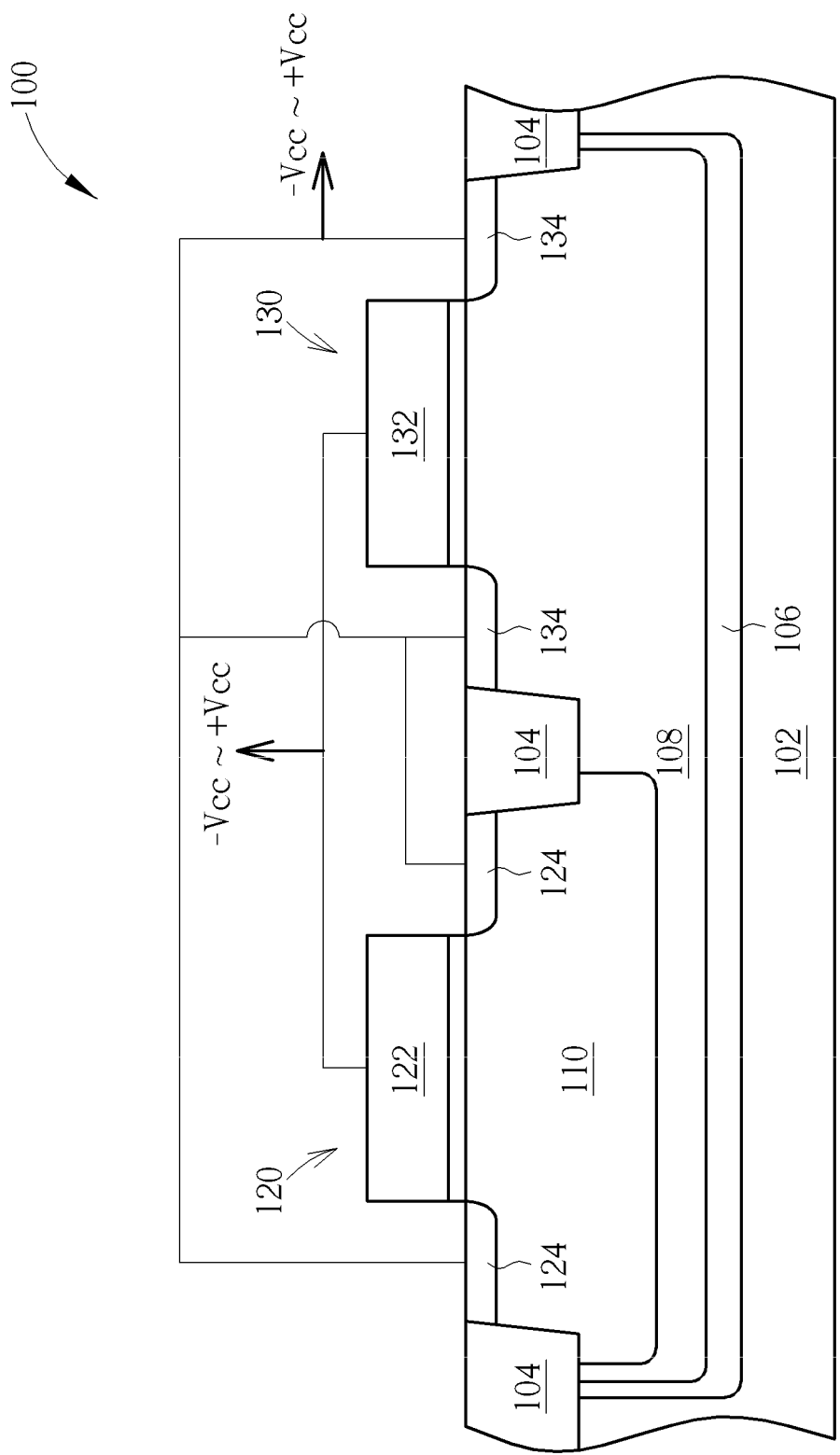
FIG. 2 is a schematic drawing illustrating a MOS capacitor provided by a first preferred embodiment of the present invention.

Please refer to FIG. 2, which is a schematic drawing illustrating a MOS capacitor provided by a first preferred embodiment of the present invention. As shown in FIG. 2, the MOS capacitor 100 provided by the preferred embodiments includes a substrate 102, such as a p-type substrate (p-substrate) 102. A plurality of electrical isolation structures such as shallow trench isolations (STIs) 104 is formed in the p-substrate 102 for providing electrical isolation. The MOS capacitor 100 provided by the preferred embodiment further includes a deep n-type well (n-well) 106 formed in the p-substrate 100. It should be noted that the deep n-well 106 is formed in the p-substrate 102 at where the MOS capacitor is to be accommodated. In addition, the p-substrate 102 is grounded while the deep n-well 106 is floated or electrically connected to a power supply voltage (Vcc).

Please still refer to FIG. 2. The MOS capacitor 100 provided by the preferred embodiment further includes a p-type well (p-well) 108 and an n-type well (n-well) 110 both formed in and encompassed by the deep n-well 102 as shown in FIG. 2. More important, the p-well 108 is not only deep than the n-well 100 but also is formed to encompass the n-well 110 as shown in FIG. 2.

According to the preferred embodiment, the MOS capacitor 100 also includes a p-type MOS (pMOS) transistor 120 and an n-type MOS (nMOS) transistor 130 positioned on the p-substrate 102. As shown in FIG. 2, the pMOS transistor 120 is formed in the n-well 110 while the nMOS transistor 130 is formed in the p-well 108. More important, the pMOS transistor 120 and the nMOS transistor 130 are electrically connected in parallel. In detail, the pMOS transistor 120 includes a p-type gate (p-gate) 122 and a p-type source/drain (p-source/drain) 124, and the nMOS transistor 130 includes a n-type gate (n-gate) 132 and an n-type source/drain (n-source/drain) 134. Though the lightly-doped drains (LDDs) of the pMOS transistor 120 and of the nMOS transistor 130 are omitted from FIG. 2, those skilled in the art would easily realize where the LDDs are formed. As shown in FIG. 2, the p-gate 122 and the n-gate 132 are electrically connected in parallel, and the p-source/drain 124 and the n-source/drain 134 are electrically connected in parallel.

Furthermore, the p-gate 122 and the n-gate 132 are electrically connected in parallel to receive the Vcc from −Vcc to +Vcc. Also, the p-source/drain 124 and the n-source/drain 134 are electrically connected in parallel to receive the Vcc from −Vcc to +Vcc. It is noteworthy that because the deep n-well 106 is deeper than the p-well 108 and the n-well 110, it prevents the pMOS transistor 120 from directly connecting to the p-substrate 100. Thus, the operation voltage range for pick-up side could be a variable from −Vcc to +Vcc.

Figure 4:
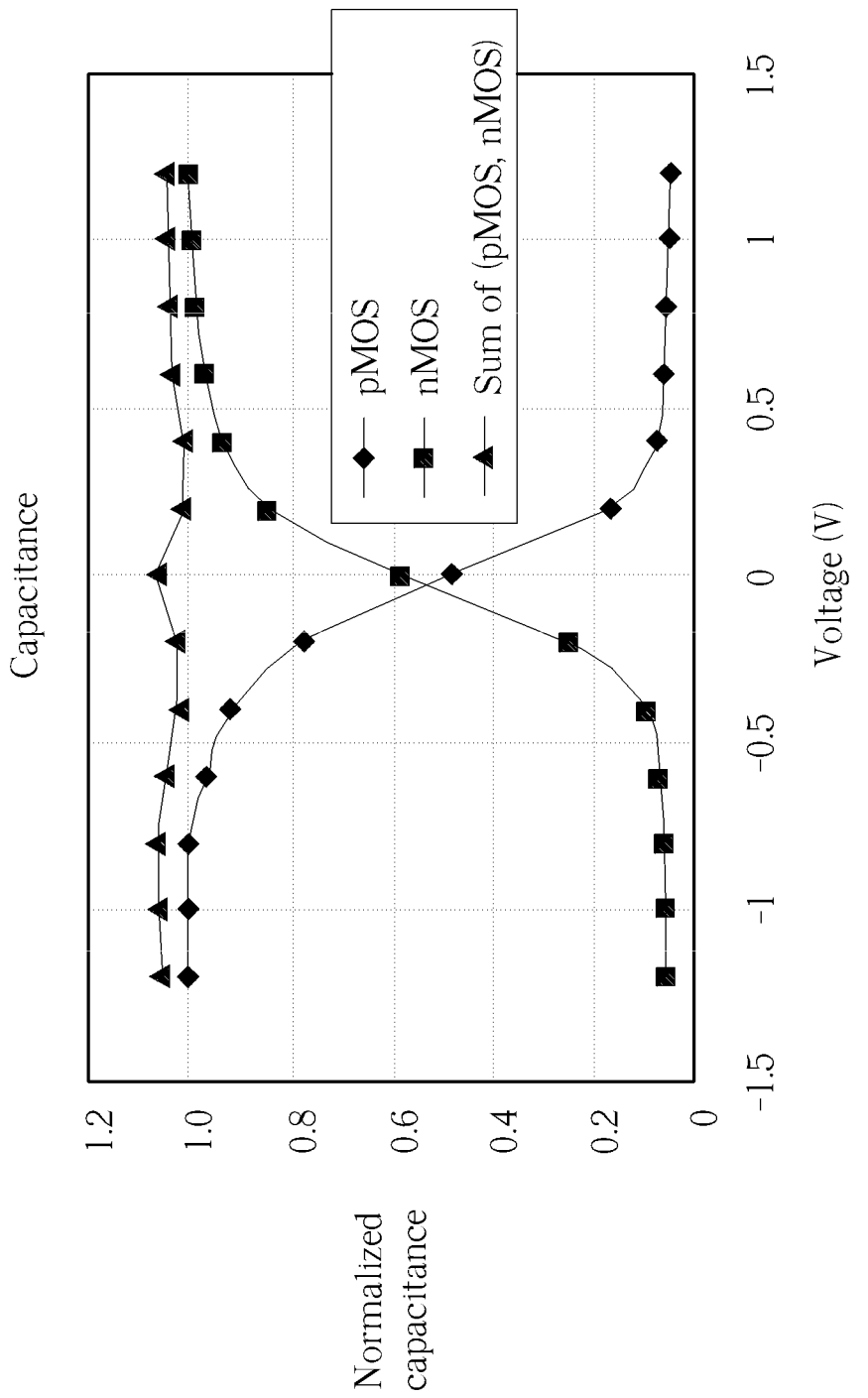
FIG. 4 shows a C-V characteristic curve of the MOS capacitor provided by the present invention.

Please refer to FIG. 4, which shows a C-V characteristic curve of the MOS capacitor 100 provided by the present invention. Accordingly, the pMOS transistor 120 and the nMOS transistor 130 electrically connected in parallel construct the MOS capacitor 100. Thus the capacitance of the MOS capacitor 100 is improved by adding the capacitance of the pMOS transistor 120 and the capacitance of the nMOS transistor 130. Consequently, the final C-V characteristic curve is much more linear as shown in FIG. 4, which means the MOS capacitor 100 is more preferable to the applications require high linearity.

Figure 3:
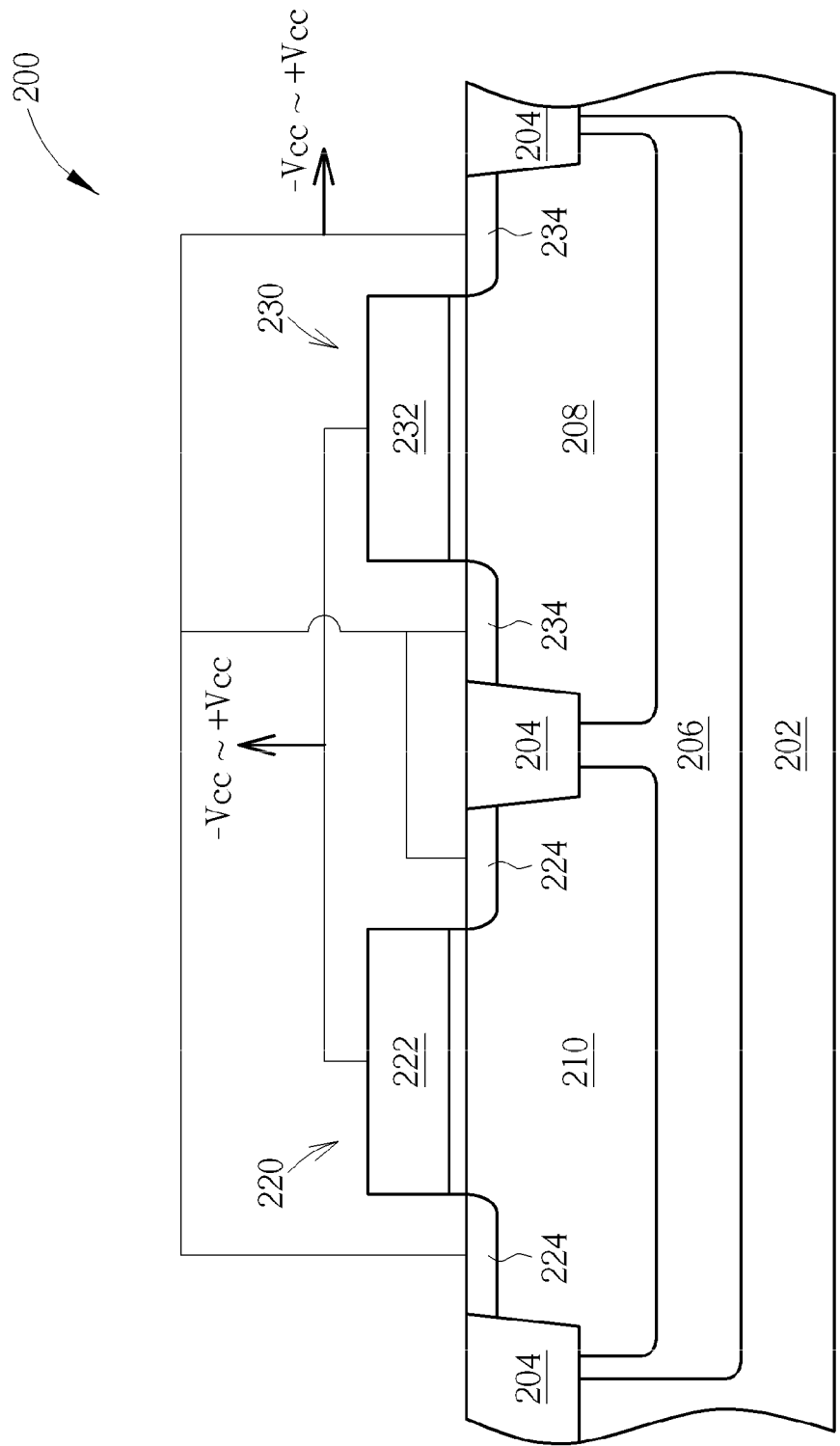
FIG. 3 is a schematic drawing illustrating a MOS capacitor provided by a second preferred embodiment of the present invention.

Please refer to FIG. 3, which is a schematic drawing illustrating a MOS capacitor provided by a second preferred embodiment of the present invention. As shown in FIG. 3, the MOS capacitor 200 provided by the preferred embodiments includes a substrate 202, such as a p-substrate 202. A plurality of electrical isolation structures such as STIs 204 is formed in the p-substrate 202 for providing electrical isolation. The MOS capacitor 200 provided by the preferred embodiment further includes a deep n-well 206 formed in the p-substrate 200. It should be noted that the deep n-well 206 is formed in the p-substrate 202 at where the MOS capacitor is to be accommodated. In addition, the p-substrate 202 is grounded while the deep n-well 206 is floated or electrically connected to a Vcc.

Please still refer to FIG. 3. The MOS capacitor 200 provided by the preferred embodiment further includes a p-well 208 and an n-well 210 both formed in and encompassed by the deep n-well 202 as shown in FIG. 3. More important, the p-well 208 and the n-well 210 are spaced apart from each other by the deep n-well 206 as shown in FIG. 3.

According to the preferred embodiment, the MOS capacitor 200 also includes a pMOS transistor 220 and an nMOS transistor 230 positioned on the p-substrate 202. As shown in FIG. 3, the pMOS transistor 220 is formed in the n-well 210 while the nMOS transistor 230 is formed in the p-well 208. More important, the pMOS transistor 220 and the nMOS transistor 230 are electrically connected in parallel. In detail, the pMOS transistor 220 includes a p-gate 222 and a p-source/drain 224, and the nMOS transistor 230 includes a n-gate 232 and an n-source/drain 234. As mentioned above, though the LDDs of the pMOS transistor 220 and of the nMOS transistor 230 are omitted from FIG. 3, those skilled in the art would easily realize where the LDDs are formed. As shown in FIG. 3, the p-gate 222 and the n-gate 232 are electrically connected in parallel, and the p-source/drain 224 and the n-source/drain 234 are electrically connected in parallel.

Furthermore, the p-gate 222 and the n-gate 232 are electrically connected in parallel to receive the Vcc from −Vcc to +Vcc. Also, the p-source/drain 224 and the n-source/drain 234 are electrically connected in parallel to receive the Vcc from −Vcc to +Vcc. As mentioned above, because the deep n-well 206 is deeper than the p-well 208 and the n-well 210 and encompasses the p-well 208 and the n-well 210, it prevents the pMOS transistor 220 from directly connecting to the p-substrate 200. Thus, the operation voltage range for pick-up side could be a variable from −Vcc to +Vcc.

Please refer to FIG. 4 again. Accordingly, the pMOS transistor 220 and the nMOS transistor 230 electrically connected in parallel construct the MOS capacitor 200. Thus the capacitance of the MOS capacitor 200 is improved by adding the capacitance of the pMOS transistor 220 and the capacitance of the nMOS transistor 230. Consequently, the final C-V characteristic curve is much more linear as shown in FIG. 4, which means the MOS capacitor 200 is more preferable to the applications require high linearity.

According to the MOS capacitor provided by the present invention, the pMOS transistor and the nMOS transistor are electrically connected in parallel to construct said MOS capacitor. Because the pMOS transistor and the nMOS transistor are electrically connected in parallel, the final MOS capacitor obtains a capacitance more linear than the conventional pMOS capacitor and/or the conventional nMOS capacitor. Consequently, the MOS capacitor provided by the present invention is more preferable to applications require high linearity. Additionally, by forming the deep n-well that encompasses the n-well in which the pMOS transistor is formed and the p-well in which the nMOS transistor is formed, freedom of biasing range is achieved and larger operation voltage is obtained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal-oxide-semiconductor capacitor (MOS capacitor) comprising:
a substrate;
a p-type MOS (pMOS) transistor comprising a p-type gate (p-gate) and a p-type source/drain (p-source/drain) positioned on the substrate; and
an n-type MOS (nMOS) transistor comprising an n-type gate (n-gate) and an n-type source/drain (n-source/drain) positioned on the substrate; wherein
the pMOS transistor and the nMOS transistor are electrically connected in parallel, the p-gate and the n-gate are electrically connected in parallel to receive a power supply voltage, and the p-source/drain and the n-source/drain are electrically connected in parallel to receive the power supply voltage.

2. The MOS capacitor according to claim 1, further comprising a deep n-type well (n-well) formed in the substrate.

3. The MOS capacitor according to claim 2, further comprising a p-type well (p-well) and an n-type well (n-well) formed in and encompassed by the deep n-well.

4. The MOS capacitor according to claim 3, wherein the pMOS transistor is formed in the n-well and the nMOS transistor is formed in the p-well.

5. The MOS capacitor according to claim 4, wherein the p-well is deeper than the n-well.

6. The MOS capacitor according to claim 5, wherein the p-well encompasses the n-well.

7. The MOS capacitor according to claim 4, wherein the p-well and the n-well are spaced apart from each other by the deep n-well.

* * * * *